(12) United States Patent
Clune et al.

(10) Patent No.: US 7,480,282 B2
(45) Date of Patent: Jan. 20, 2009

(54) METHODS AND APPARATUS FOR CONTROLLING ETHERNET PACKET TRANSFERS BETWEEN CLOCK DOMAINS

(75) Inventors: David E. Clune, Califon, NJ (US); Duan Cheng Gang, Shanghai (CN)

(73) Assignee: Agere Systems Inc., Allentown, PA (US)

( * ) Notice: Subject to any disclaimer, the term of this patent is extended or adjusted under 35 U.S.C. 154(b) by 685 days.

(21) Appl. No.: 11/082,355

(22) Filed: Mar. 17, 2005

(65) Prior Publication Data

US 2006/0209784 A1     Sep. 21, 2006

(51) Int. Cl.
*H04J 3/06* (2006.01)
(52) U.S. Cl. .................................. 370/350; 370/395.62
(58) Field of Classification Search ........................ None
See application file for complete search history.

(56) References Cited

U.S. PATENT DOCUMENTS 6,725,388 B1 * 4/2004 Susnow ...................... 713/400

2007/0286223 A1 * 12/2007 Chang et al. ................. 370/413

* cited by examiner

*Primary Examiner*—Wing F Chan
*Assistant Examiner*—Anthony Sol

(57) ABSTRACT

A transport circuit is described for generating enable signals in different independent clock domains enabling data transfers across the clock domains. The transport circuit is used, for example, in an Ethernet receive interface where data is to be transferred from a receive clock domain to a system core clock domain for further processing. A serial to parallel data converter is used to convert the serial Ethernet data into parallel form. The output of the serial to parallel data converter is transferred to a holding register in the receive clock domain. The holding register connects to a transfer data register that is in the system core clock domain. The transport circuit provides enable signals with the proper timing to allow the transfer of data from the receive clock domain to the system core clock domain. The last data transfer swaps the interface supplied data with a status word in the holding register.

17 Claims, 5 Drawing Sheets

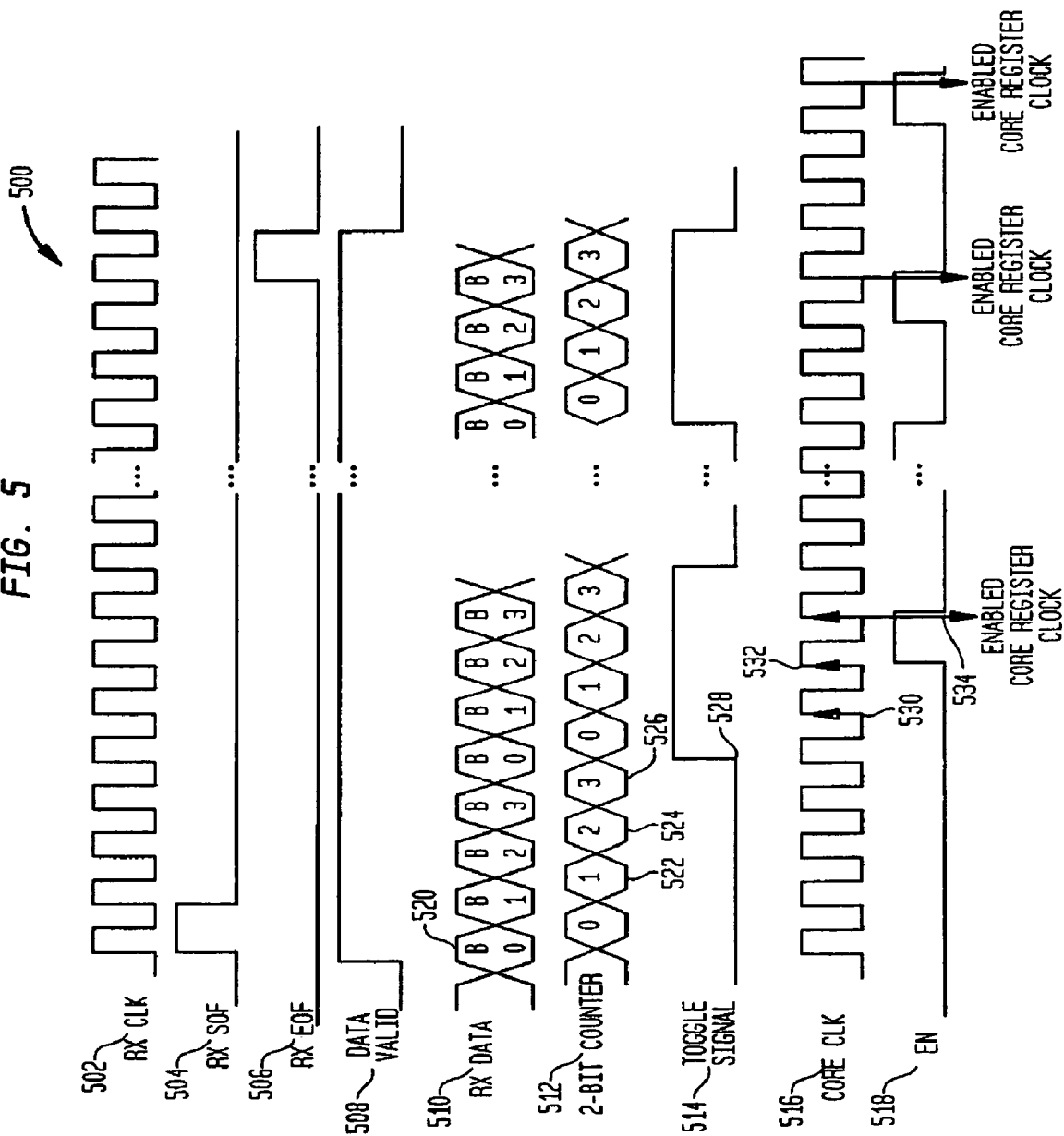

ent invention relates generally to improved methods and apparatus for controlling data transfers between clock domains, and more particularly to advantageous techniques for controlling Ethernet data transfers between a receiving clock domain and a system core clock domain.

METHODS AND APPARATUS FOR CONTROLLING ETHERNET PACKET TRANSFERS BETWEEN CLOCK DOMAINS

FIELD OF THE INVENTION

The present invention relates generally to improved methods and apparatus for controlling data transfers between clock domains, and more particularly to advantageous techniques for controlling Ethernet data transfers between a receiving clock domain and a system core clock domain.

BACKGROUND OF INVENTION

The Ethernet standard is a local area network (LAN) standard, Institute of Electrical and Electronic Engineers (IEEE) 802.3, which is widely used. The increased use of the internet and increasing bandwidth requirements due to multimedia data types such as video have extended the Ethernet standard to accommodate increasing data rates. For example, the overarching 802.3 standard presently contains multiple separate standards to accommodate Ethernet systems operating at various data rates, such as, 10 million bits per second (Mbps), 100 Mbps, 1 gigabits per second (Gbps), and 10 Gbps.

The 802.3 physical layer describes the data rates, how signals are handled, and provides interconnecting specifications covering, for example, copper and fiber optic cabling. The media access control (MAC) layer defines the protocol and data formats used in the interface, including data packet definition, error recovery, and the like. The Ethernet signals on the interface operate at a data rate within the bounds of the standards but asynchronous to the system connected to the Ethernet network. The asynchronous aspects of this interface require that data received from the network in synchronism with the network clock domain must transfer in the connected system to the system's clock domain. This clock domain transfer can typically be expensive and potentially prone to errors.

SUMMARY OF INVENTION

Among its several aspects, the present invention recognizes that there is a need for improved methods and apparatus to transfer data packets from a receive clock domain to a system core clock domain.

One embodiment of the present invention addresses a circuit for generating enable signals in different independent clock domains enabling data transfers across the clock domains. The data to be transferred is received in a data transport circuit as data elements in sequential steps along with a receive clock, a core clock being independent of the receive clock, and a data valid signal, where the data elements and the data valid signal are in sync with the receive clock. A multi-bit counter is operative upon receipt of the data valid signal. The multi-bit counter counts the number of sequential steps required to assemble the data elements into a group of data elements. The multi-bit counter also generates a first enable signal and changes the state of a toggle signal based on achieving a count that corresponds to the group of data elements being assembled. Also, a second enable signal is generated responsive to the toggle signal. The first enable signal enables the loading of the group of data elements into holding registers and the second enable signal enables the transfer of the group of data elements from the holding registers to core registers in sync with the core clock.

Another embodiment of the present invention addresses an Ethernet receive apparatus for transferring data across clock boundaries. Ethernet serial data is converted to parallel data in an Ethernet serial to parallel data converter operating in sequential steps having a last serial to parallel conversion step for each data conversion and operating in sync with a receive clock to output parallel data on an Ethernet parallel data output. A holding register is loaded with the parallel data in sync with the receive clock and output the parallel data on a holding register output. An enable circuit operating in sync with the receive clock to produce a toggle signal indicating the occurrence of the last serial to parallel conversion step for each data conversion and operating in sync with a core clock to produce a transfer enable signal responsive to the toggle signal. An Ethernet data transfer register, connected to the holding register output and to the transfer enable signal, operating to output the parallel data in sync with the core clock.

A further embodiment of the present invention addresses a method for generating enable signals in different independent clock domains enabling data transfers across the clock domains. The method receives multiple signals in a data transport circuit including data elements, a receive clock, a core clock being independent of the receive clock, and a data valid signal. The method counts the number of sequential steps required to assemble the received data elements into a group, generates enable signals based on different count values, and changes the state of a toggle signal based on achieving a count that corresponds to the group of data elements being assembled. The enable signals enabling data transfer operations in the data transport circuit in sync with the receive clock. The method also generates a transfer enable signal responsive to the toggle signal with the transfer enable signal being in sync with the core clock. The transfer enable signal enabling the transfer of data in the data transport circuit in sync with the core clock.

A more complete understanding of the present invention, as well as other features and advantages of the invention, will be apparent from the following detailed description and the accompanying drawings.

BRIEF DESCRIPTION OF DRAWINGS

FIG. 5 presents a timing diagram illustrating the sequence of operations of the implementation of FIG. 3 in accordance with the present invention.

DETAILED DESCRIPTION

The present invention will now be described more fully with reference to the accompanying drawings, in which several embodiments of the invention are shown. This invention may, however, be embodied in various forms and should not be construed as being limited to the embodiments set forth herein. Rather, these embodiments are provided so that this disclosure will be thorough and complete, and will fully convey the scope of the invention to those skilled in the art.

Figure 1:
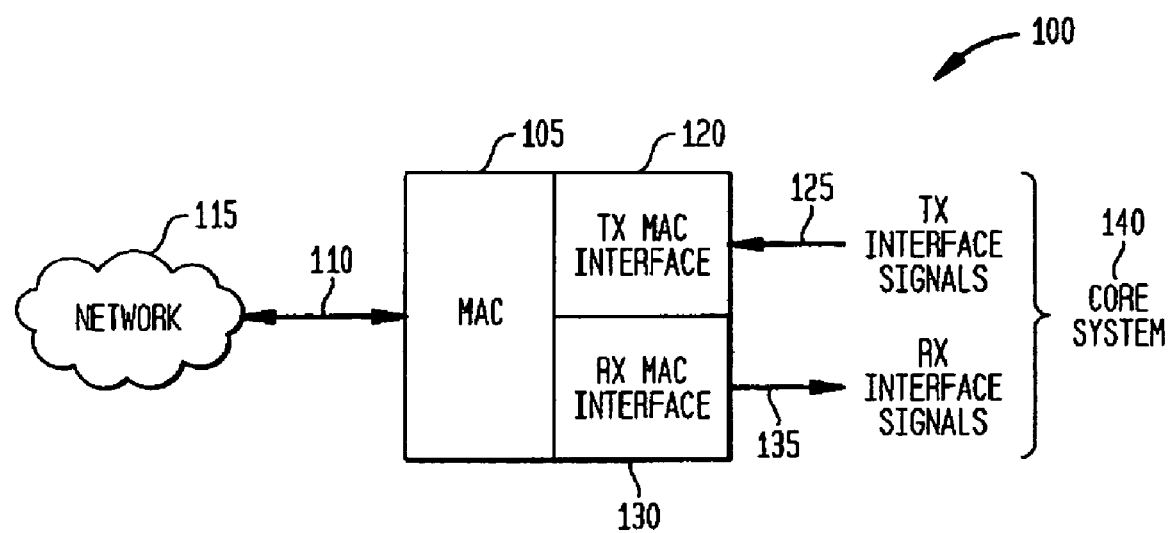
FIG. 1 illustrates a gigabit Ethernet MAC with transmit (TX) and receive (RX) interfaces in accordance with the present invention.

FIG. 1 illustrates a high level view of an Ethernet controller 100, such as a gigabit Ethernet controller (GEC), consisting of a media access control (MAC) 105 with a network interface 110, such as a gigabit media independent interface (GMII), connecting to network 115 and meeting IEEE 802.3 standard and its subsections, for example, subsections for a gigabit Ethernet local area network. The MAC 105 interfaces with a transmit MAC interface (TX MAC) 120 for the TX interface signals 125. The MAC 105 also interfaces with a receive MAC interface (RX MAC) 130. The RX MAC 130 is the source for the RX interface signals 135. Both TX interface signals 125 and RX interface signals 135 operate in synchronism with the core system 140 at the core clock rates.

The RX MAC interface 130 receives data in an eight bit serial interface, assembles the data into a parallel form, and transfers the assembled data across the clock domain from the receiver MAC clock to the core system clock. While this clock domain crossing has typically been accomplished with an asynchronous first in first out (FIFO) buffer of some capacity, depending upon the system, it has been determined that an alternative efficient method can be accomplished using the techniques of the present invention. In addition, a received Ethernet data packet ends with a cyclic redundancy check (CRC) word which can be stripped off the data packet and replaced with a status word to aid in processing of the data packet. For example, the status word may contain the number of valid bytes in the received data packet.

Figure 2:
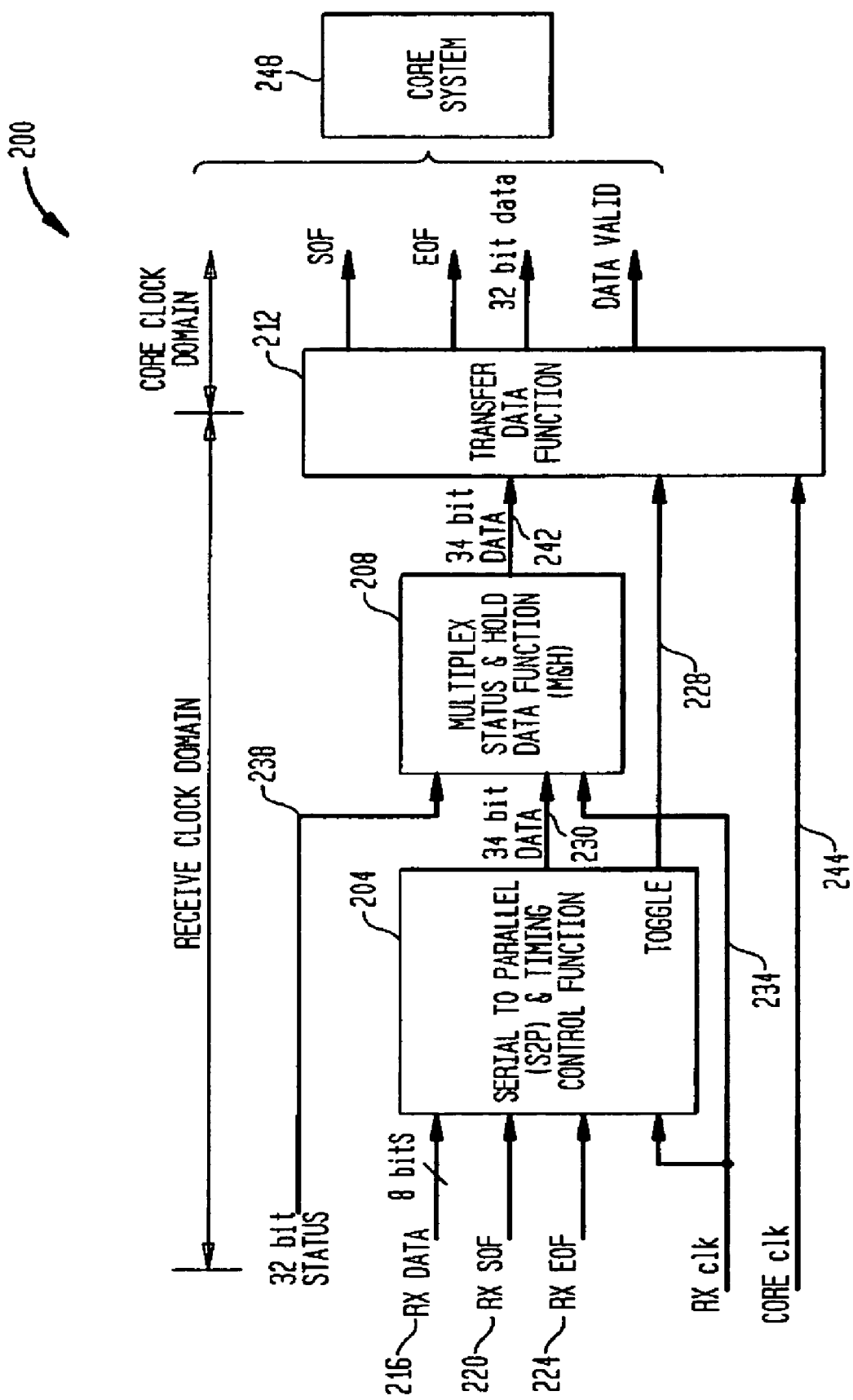
FIG. 2 illustrates a three stage receive packet transfer circuit in accordance with the present invention.

FIG. 2 illustrates a clock crossing data flow apparatus 200 having a serial to parallel (S2P) and timing control function 204, a multiplex status and hold data (M&H) function 208, and a transfer data function 212. Eight bit receive (Rx) data 216 and a receive start of frame signal (Rx SOF) 220 are received in the S2P and timing control function 204 where the 8 bit serial data is assembled into a 32 bit data word in a serial data to parallel data converter. At the end of the data frame, an end of frame (Rx EOF) signal 224 is also received and both the Rx SOF 220 and Rx EOF 224 signals are latched for transfer along with the 32-bits of data. A toggle signal 228 is generated at one fourth the clock frequency of the received data rate to inform the transfer data function 212 that a word of data is ready for transfer.

A 32-bit received word, an SOF bit, and an EOF bit make up a 34-bit data packet 230 that is transferred to a holding register in the M&H function 208 to make room for the next stream of data to be received. The 34-bits of data are transferred every fourth receive clock (Rx clk) 234 to the holding register in the M&H function 208. The last data word in a data frame to be transferred is a CRC word and it is replaced with a status word 238 and stored in the holding register.

The toggle signal 228 is used in the transfer data function 212 to transfer the 34-bits of data 242 from the M&H function 208 in synchronism with the core clock (Core clk) 244. This data is then ready for the core system 248 to use. An internal 2-bit counter is used in the generation of the toggle signal 228.

Figure 3:
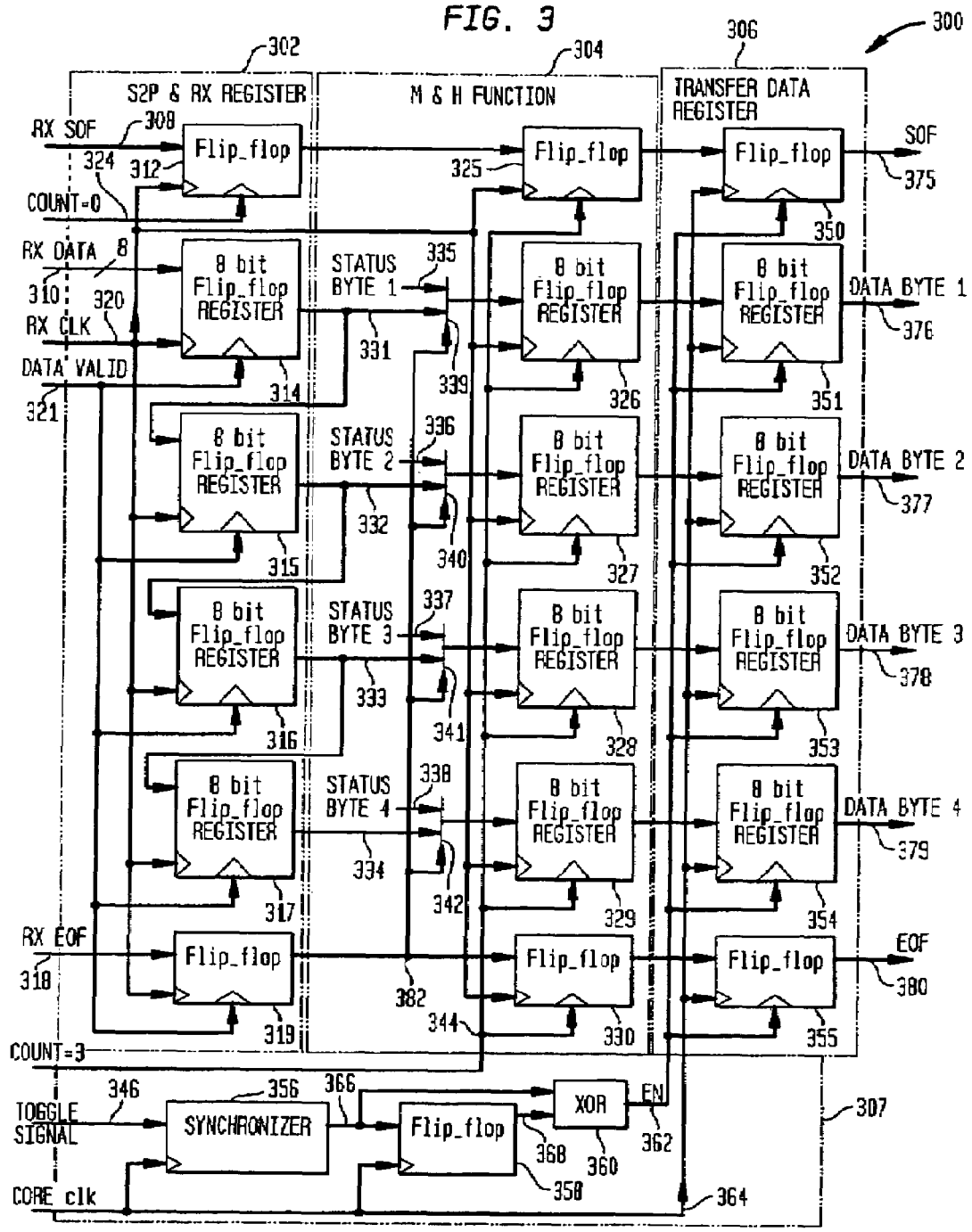
FIG. 3 illustrates an exemplary implementation of the three stage receive packet transfer circuit of FIG. 2 in accordance with the present invention.

FIG. 3 illustrates an embodiment of the clock crossing data flow 300 with a data transport circuit having an S2P and Rx register 302, an M&H function 304, and a transfer data register 306. The transfer data register 306 interfaces with a transfer enable circuit 307. The S2P and Rx register 302 receives an Rx SOF signal 308 in sync with the first byte of the receive data (Rx Data) 310 and stores the state of the Rx SOF signal 308 in a storage flip flop 312. Rx Data 310 is received as 8 bit serial data and converted to 32-bit parallel data in a shift register made up of four eight bit sections 314-317. An Rx EOF signal 318 is received in the S2P and Rx register 302, and the state of the Rx EOF signal 318 is stored in a flip flop 319. The receive clock (Rx Clk) 320 is used to clock the Rx Data 310, and the Rx EOF signal 318 into storage elements 314-317, and 319, respectively. Data Valid signal 321 acts as an enable signal to the storage elements 314-317, and 319. The Rx SOF signal 308 is clocked into flip flop 312 by Rx Clk 320. The flip flop 312 is enabled by a count=0 signal 324. The timing of operations in the S2P and Rx register 302 is described in further detail below in connection to the discussion of FIGS. 4 and 5.

The M&H function 304 contains a flip flop 325, four eight bit storage registers 326-329, and a flip flop 330, providing temporary storage for the 34-bits of data from the S2P and Rx register 302 or a status word for the last word of a data frame. The data bytes 331-334 from the S2P and Rx register 302 are multiplexed with four status bytes, 335-338, respectively, in multiplexers 339-342. The M&H function 304 storage elements 325-330 are enabled by a count=3 signal 344 from a 2-bit counter (not shown in FIG. 3, but described in detail below in connection with the discussion of FIGS. 4 and 5) used to generate a toggle signal 346. The storage elements 325-330 are clocked by Rx Clk 320. The timing of operations in the M&H function 304 is described in further detail below in connection with the discussion of FIGS. 4 and 5.

The transfer data register 306 contains a flip flop 350, four eight bit storage registers 351-354, and a flip flop 355 providing temporary storage for the 34-bits of data from the flip flop 325, the four eight bit storage registers 326-329, and the flip flop 330, respectively. The transfer enable circuit 307 contains a synchronizer 356, flip flop 358, and exclusive or (XOR) gate 360 to generate an enable signal EN 362 for the 34-bit storage elements 350-355. The core clock (Core Clk) 364 is used in the synchronizer 356 to transform the toggle signal 346 that is in sync with the receive clock Rx clock 320 to a toggle2 signal 366 that is in sync with the Core Clk 364. The toggle2 signal 366 and output 368 of flip flop 358 are input to XOR gate 360 to generate the enable signal EN 362. The storage elements 350-355 are clocked by Core Clk 364. These storage elements 350-355 provide outputs 375-380 to the core system in sync with the core clock. The timing of operations in the transfer data register 306 is described in further detail below in connection with FIGS. 4 and 5.

Figure 4:
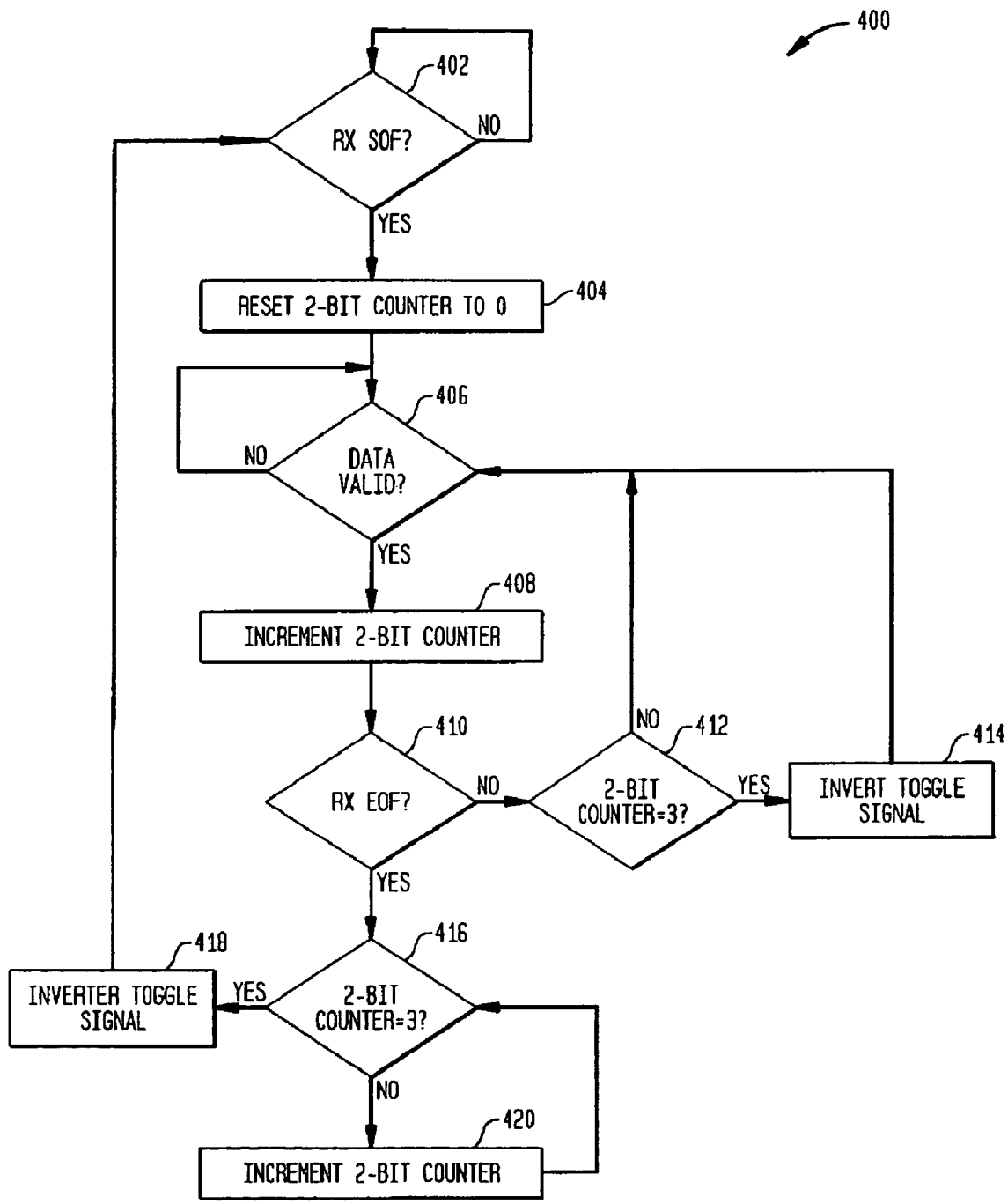
FIG. 4 illustrates a control flow chart for generating a toggle signal used in the transfer of data between two clock domains.

FIG. 4 illustrates a flow chart 400 for the generation of a toggle signal, such as toggle signal 346. When an Rx SOF signal is detected in step 402, a 2-bit counter is reset to zero in step 404 and the first data byte is received. In step 406, a further check is made to determine if valid data has been received. If Data Valid is active, then the 2-bit counter is incremented in step 408 for the second byte received by use of a receive clock, such as Rx Clk 320. If it is determined in step 410 that a receive end of frame signal, such as Rx EOF signal 318, has not been received, then a further test is made in step 412. In step 412, it is determined whether the 2-bit counter is equal to 3. If this count value is not equal to 3, it is determined whether the Data Valid signal is still active in step 406. If Data Valid is active, the 2-bit counter increments again in step 408 and the above described path is followed through steps 410, 412, 406, 408, 410, 412 until a count of 3 is reached. The 2-bit counter increments counting 0, 1, 2, and 3 and then wraps back around to repeat the count. At the count of 3, the test in 412 is positive and the toggle signal is inverted in step 414. A count of 0 generates a count=0 signal, such as the count=0 signal 324 of FIG. 3 and a count of 3 generates a count=3 signal, such as the count=3 signal 344 of FIG. 3. Count=0 and count=3 are generated by the indicated count value when the counter is clocked by the rising edge of the receive clock. This counter process continues until an end of frame signal is received, such as the Rx EOF signal 318. Since data packets may not contain a number of bytes that is a multiple of four, a test is made in step 416 to determine the state of the 2-bit counter. If the counter=3, as it will be for data packets containing a number of bytes that are a multiple of four, then the toggle signal is inverted in step 418 to ensure data is transferred in the same fashion as the previous received data words. On the other hand, if the counter is not equal to 3, then the counter is incremented in step 420 until its value equals 3 and processing continues with step 418.

FIG. 5 is a timing chart 500 illustrating the relationship of signals of interest in the operation of the clock crossing data flow apparatus 300 of FIG. 3. Specifically, exemplary timings are presented for Rx Clk 502, Rx SOF 504, Rx EOF 506, Data Valid 508, Rx Data 510, 2-bit counter 512, toggle signal 514, Core Clk 516, and EN 518 which may suitably be employed as the like-named signals in FIG. 3. The Rx Clk 502 and the Core Clk 516 are both operating at approximately the same frequency, such as 125 MHz, for example, but are independently generated and, consequently, out of sync with each other. The Rx SOF 504, Rx EOF 506, Data Valid 508, Rx Data 510, 2-bit counter 512, toggle signal 514 are all operating in sync with the Rx Clk 502. The enable signal EN 518 is in sync with the Core Clk 516.

In operation, an incoming data packet begins with a start of frame signal Rx SOF 504 in sync with the first byte of data B0 520 and with Data Valid 508 active the Rx Clk 502 clocks the data B0 520 into the 8 bit register 315. For the following data bytes in the data packet, the Rx Clk 502 clocks the 2-bit counter following the path 406, 408 for a count of 1 corresponding to 522, 410, and 412, 406, 408 generating a count of 2 524 and continuing until a count of 3 526 is reached. The Rx Clk 502, such as Rx Clk 320, clocks the Rx SOF 308 into flip flop 312 when the count=0 324 is active. When count=3 344 is active, corresponding to 526 in the timing chart, the M&H function storage elements 325-330 are enabled to store a data word or status word. In addition, when the count is equal to 3, the toggle signal 346 is inverted corresponding to edge 528 in the timing chart. The toggle signal 346 is received in the synchronizer 356 which on the next rising edge of the core clock (Core Clk) 364, corresponding to edge 530 in the timing chart, clocks the toggle signal into the synchronizer. The synchronizer consists of two flip flops and on the second rising edge of the Core Clk 364, corresponding to edge 532 in the timing chart, the toggle2 signal 366 is generated that is input to the XOR gate 360. Since the flip flop 358 holds the prior state of the toggle2 signal, the XOR gate 360 changes EN signal 362 to an active state until the toggle2 signal is clocked into flip flop 358. The EN signal 362 being active allows the data from the receive clock domain storage elements 325-330 to be transferred to the core clock domain storage elements 350-355, corresponding to edge 534 in the timing chart. This process continues until the end of frame word is received at which point the stored EOF signal 382 is used to enable the multiplexers 339-342 to substitute a status word in place of the CRC word received on the data path.

While the present invention has been disclosed in a presently preferred context, it will be recognized that the present teachings may be adapted to a variety of contexts consistent with this disclosure and the claims that follow.

For example, the present invention specifically addresses a 2-bit counter supporting an 8-bit serial to 32-bit parallel converter. It will appreciated that a log 2(x/y)-bit counter, in general, can be used for a y-bit serial to x-bit parallel converter, where x and y are power of 2 values. It will also be appreciated that variations in clock timing of the data registers and counter are feasible using variations of the Rx Clk and Core Clk. For example, buffered, gated, or inverted clocks, may be useful depending upon the process technology and layout issues that affect timing. Other such modifications and adaptations to suit a particular design application will be apparent to those of ordinary skill in the art.

We claim:

1. An apparatus for generating enable signals in different independent clock domains enabling data transfers across the clock domains, the apparatus comprising:

a data transport circuit for receiving data elements in sequential steps during a receive frame, receiving a receive clock, a core clock being independent of the receive clock, and a data valid signal that becomes active upon receiving valid data, where the data elements and the data valid signal are in sync with the receive clock;

a multi-bit counter which is operative once the data valid signal becomes active, the multi-bit counter counting the number of sequential steps required to assemble the data elements into a group of data elements, the counting wraps the multi-bit counter to an initial count after the group of data elements is assembled, the multi-bit counter generating a first enable signal that enables the loading of the group of data elements into holding registers, the multi-bit counter changing the state of a toggle signal based on achieving a count that corresponds to the group of data elements being assembled, wherein the multi-bit counter is a $\log_2(x/y)$-bit counter for y-bit receive data elements to be assembled into an x-bit group of receive data elements, x and y both being a power of 2; and an enable circuit operating in synchronism with a core clock, the enable circuit generating a second enable signal responsive to the toggle signal, the second enable signal enabling the transfer of the group of data elements from the holding registers to core registers in sync with the core clock.

2. An apparatus for generating enable signals in different independent clock domains enabling data transfers across the clock domains, the apparatus comprising:

a data transport circuit for receiving data elements in sequential steps during a receive frame, receiving a receive clock, a core clock being independent of the receive clock, and a data valid signal that becomes active upon receiving valid data, where the data elements and the data valid signal are in sync with the receive clock;

a multi-bit counter which is operative once the data valid signal becomes active, the multi-bit counter counting the number of sequential steps required to assemble the data elements into a group of data elements, the counting wraps the multi-bit counter to an initial count after the group of data elements is assembled, the multi-bit counter generating a first enable signal that enables the loading of the group of data elements into holding registers, the multi-bit counter changing the state of a toggle signal based on achieving a count that corresponds to the group of data elements being assembled; and an enable circuit operating in synchronism with a core clock, the enable circuit generating a second enable signal responsive to the toggle signal, the second enable signal enabling the transfer of the group of data elements from the holding registers to core registers in sync with the core clock, wherein the toggle signal holds state for a duration equal to the time for assembling the receive data elements into the group, when an end of frame signal is received prior to the multi-bit counter achieving the count that corresponds to the group of receive data elements being assembled.

3. An Ethernet receive apparatus for transferring data across clock boundaries, the apparatus comprising:

an Ethernet serial to parallel data converter receiving Ethernet serial data on an Ethernet serial data input, the Ethernet serial to parallel data converter operating in sequential steps having a last serial to parallel conversion step for each data conversion and operating in sync with a receive clock to output parallel data on an Ethernet parallel data output;

a holding register connected to the Ethernet parallel data output, operating in sync with the receive clock to load the parallel data in the holding register and output the parallel data on a holding register output;

an enable circuit operating in sync with the receive clock to produce a toggle signal indicating the occurrence of the last serial to parallel conversion step for each data conversion and operating in sync with a core clock to produce a transfer enable signal responsive to the toggle signal; and an Ethernet data transfer register, having an input connected to the holding register output and an input connected to the enable circuit to receive the transfer enable signal, the Ethernet data transfer register operating to output the parallel data in sync with the core clock, wherein the enable circuit further comprises:

a multi-bit counter operating in sync with the receive clock, counting the number of steps to convert the Ethernet serial data to parallel data, generating a load enable signal for the holding register, and changing the state of a toggle signal based on the multi-bit counter reaching a count corresponding to the last serial to parallel data conversion step; and a transfer enable circuit operating in sync with the core clock to generate a transfer enable signal based on the changing state of the toggle signal.

4. The apparatus of claim 3 wherein the load enable signal for the holding register is active when the multi-bit counter reaches a count corresponding to the last serial to parallel data conversion step.

5. The apparatus of claim 3 wherein the toggle signal holds state after receiving an end of frame (EOF) signal for a duration equal to a timing of the toggle signal during a preceding data transfer operation when no EOF signal had been received, whereby the duration of the toggle signal for all data transfer operations is the same independent of when an EOF signal is received.

6. An Ethernet receive apparatus for transferring data across clock boundaries, the apparatus comprising:

an Ethernet serial to parallel data converter receiving Ethernet serial data on an Ethernet serial data input, the Ethernet serial to parallel data converter operating in sequential steps having a last serial to parallel conversion step for each data conversion and operating in sync with a receive clock to output parallel data on an Ethernet parallel data output;

a holding register connected to the Ethernet parallel data output, operating in sync with the receive clock to load the parallel data in the holding register and output the parallel data on a holding register output;

an enable circuit operating in sync with the receive clock to produce a toggle signal indicating the occurrence of the last serial to parallel conversion step for each data conversion and operating in sync with a core clock to produce a transfer enable signal responsive to the toggle signal;

an Ethernet data transfer register, having an input connected to the holding register output and an input connected to the enable circuit to receive the transfer enable signal, the Ethernet data transfer register operating to output the parallel data in sync with the core clock and a multiplexer placed between the Ethernet serial to parallel data converter and the holding register with the multiplexer output connected to the holding register input, the multiplexer with one of at least two inputs to the multiplexer being the Ethernet parallel data output, a second input being a status word, the multiplexer selecting one of the inputs as an output, and the selection signal being generated from the end of frame signal.

7. An Ethernet receive apparatus for transferring data across clock boundaries, the apparatus comprising:

an Ethernet serial to parallel data converter receiving Ethernet serial data on an Ethernet serial data input, the Ethernet serial to parallel data converter operating in sequential steps having a last serial to parallel conversion step for each data conversion and operating in sync with a receive clock to output parallel data on an Ethernet parallel data output;

a holding register connected to the Ethernet parallel data output, operating in sync with the receive clock to load the parallel data in the holding register and output the parallel data on a holding register output;

an enable circuit operating in sync with the receive clock to produce a toggle signal indicating the occurrence of the last serial to parallel conversion step for each data conversion and operating in sync with a core clock to produce a transfer enable signal responsive to the toggle signal;

an Ethernet data transfer register, having an input connected to the holding register output and an input connected to the enable circuit to receive the transfer enable signal, the Ethernet data transfer register operating to output the parallel data in sync with the core clock; and a multi-bit counter that is a $\log_2(x/y)$-bit counter for Ethernet serial y-bit data to be converted to x-bit parallel data, the x and y values both being a power of 2.

8. The apparatus of claim 7 wherein the multi-bit counter is a 2-bit counter for Ethernet serial y=8-bit data to be converted to x=32-bit parallel data.

9. The apparatus of claim 8 wherein the load enable signal for the holding register is active for a count equals three of the 2-bit counter.

10. An Ethernet receive apparatus for transferring data across clock boundaries, the apparatus comprising:

an Ethernet serial to parallel data converter receiving Ethernet serial data on an Ethernet serial data input, the Ethernet serial to parallel data converter operating in sequential steps having a last serial to parallel conversion step for each data conversion and operating in sync with a receive clock to output parallel data on an Ethernet parallel data output;

a holding register connected to the Ethernet parallel data output, operating in sync with the receive clock to load the parallel data in the holding register and output the parallel data on a holding register output;

an enable circuit operating in sync with the receive clock to produce a toggle signal indicating the occurrence of the last serial to parallel conversion step for each data conversion and operating in sync with a core clock to produce a transfer enable signal responsive to the toggle signal; and an Ethernet data transfer register, having an input connected to the holding register output and an input connected to the enable circuit to receive the transfer enable signal, the Ethernet data transfer register operating to output the parallel data in sync with the core clock, wherein the holding register and Ethernet data transfer register may store additional bits of information and these additional bits of information are transferred between the holding register and the Ethernet data transfer register along with the Ethernet parallel data.

11. The apparatus of claim 10 wherein the additional bits of information are an indication of receiving a start of frame signal and an indication of receiving an end of frame signal.

12. A method for generating enable signals in different independent clock domains enabling data transfers across the clock domains, the method comprising:
 receiving multiple signals in a data transport circuit including data elements, a receive clock, a core clock being independent of the receive clock, and a data valid signal, where the data elements and data valid signal are in sync with the receive clock;
 counting in a multi-bit counter, when the data valid signal becomes active, the number of sequential steps required to assemble the data elements into a group, wherein the counting wraps the multi-bit counter to an initial count for every group of data elements assembled;
 generating enable signals based on different counts of the multi-bit counter, the enable signals enabling data transfer operations in the data transport circuit in sync with the receive clock;
 changing the state of a toggle signal based on achieving a count that corresponds to the group of data elements being assembled;
 generating a transfer enable signal responsive to the toggle signal, the transfer enable signal being in sync with a core clock, the transfer enable signal enabling the transfer of data in the data transport circuit in sync with the core clock; and
 counting in the multi-bit counter after receiving an end of frame (EOF) signal when the multi-bit counter is not already at the count value that corresponds to the group of data elements being assembled until the count value is achieved that corresponds to the group of data elements being assembled.

13. The method of claim 12 wherein the enable signals are a first enable signal that is active for an initial count value and a second enable signal that is active upon achieving the count value that corresponds to the group of data elements being assembled.

14. The method of claim 13, wherein the data transport circuit further comprises a data converter, a holding register, and a transfer data register.

15. The method of claim 14 further comprising:
 enabling the data converter to assemble the data elements into groups of data elements once the data valid signal becomes active;
 loading a first portion of the holding register with additional information when enabled by the first enable signal; and
 loading a second portion of the holding register with a group of data elements when enabled by the second enable signal.

16. The method of claim 15 further comprising:
 enabling the transfer data register with the transfer enable signal;
 transferring the contents of the holding register to the transfer data register in synchronism with the core clock that is independent of the receive clock.

17. The method of claim 12 further comprising:
 returning the multi-bit counter to a quiescent state after receiving an EOF signal and after the count value has been achieved that corresponds to the group of data elements being assembled; and
 waiting in the quiescent state for a start of frame signal and data valid signal to be received before the multi-bit counter becoming operative.

* * * * *